United States Patent [19]

McHargue

[11] Patent Number: 4,532,149
[45] Date of Patent: Jul. 30, 1985

[54] METHOD FOR PRODUCING HARD-SURFACED TOOLS AND MACHINE COMPONENTS

[75] Inventor: Carl J. McHargue, Farragut, Tenn.

[73] Assignee: The United States of America as represented by the United States Department of Energy, Washington, D.C.

[21] Appl. No.: 517,049

[22] Filed: Jul. 27, 1983

Related U.S. Application Data

[63] Continuation-in-part of Ser. No. 313,413, Oct. 21, 1981, abandoned.

[51] Int. Cl.³ .............................................. C23C 17/00
[52] U.S. Cl. ...................................... 427/38; 428/426
[58] Field of Search ........................... 427/38; 428/426

[56] References Cited

U.S. PATENT DOCUMENTS

| | | | |
|---|---|---|---|
| 3,704,166 | 11/1972 | Cuomo | 427/38 |
| 3,915,757 | 10/1975 | Engel | 427/38 |
| 4,088,799 | 5/1978 | Kurtin | 427/38 |
| 4,296,144 | 10/1981 | Maby | 427/38 |

OTHER PUBLICATIONS

G. B. Krefft et al., "Volume Expansion and Annealing Compaction of Ion Bombarded Single Crystal & Polycrystalline $\alpha Al_2O_3$", App Physics, vol. 49 (May '78).
A. Carnera et al., "Atom Location in Complex Lattices: Pb in $\alpha Al_2O_3$", Radiation Effects, vol. 49, p. 29 (1980).
A. V. Drigo et al., "Lattice Disorder in Implanted Insulators: Pb Implantation in $\alpha Al_2O_3$", Radiation Effects, vol. 33, pp. 161-171 (1977).

Primary Examiner—Ellis P. Robinson
Attorney, Agent, or Firm—Earl L. Larcher; Stephen D. Hamel; Judson R. Hightower

[57] ABSTRACT

In one aspect, the invention comprises a method for producing tools and machine components having super-hard crystalline-ceramic work surfaces. Broadly, the method comprises two steps: A tool or machine component having a ceramic near-surface region is mounted in ion-implantation apparatus. The region then is implanted with metal ions to form, in the region, a metastable alloy of the ions and said ceramic. The region containing the alloy is characterized by a significant increase in hardness properties, such as microhardness, fracture-toughness, and/or scratch-resistance. The resulting improved article has good thermal stability at temperatures characteristic of typical tool and machine-component uses. The method is relatively simple and reproducible.

5 Claims, 5 Drawing Figures

METHOD FOR PRODUCING HARD-SURFACED TOOLS AND MACHINE COMPONENTS

The invention was made as a result of a contract with the U.S. Department of Energy. This is a continuation-in-part of application Ser. No. 313,413(79) filed Oct. 21, 1981, abandoned.

BACKGROUND OF THE INVENTION

This invention relates generally to the hardening of ceramic-surfaced articles. More particularly, it relates to a method for hardening ceramic-surfaced tools and machine components and to the hardened articles so produced.

Industry's continuing search for harder and longer-lived tools and machine components has led to the development of ceramic-surfaced drills, bearings, valve seats, saws, linings, and the like. Although such articles have been in widespread use for many years, it has long been evident that a simple and practical method for increasing the hardness properties of such articles would be a valuable and important advance in the art. Ceramic-surfaced tools and machine elements are composed throughout of the ceramic or are provided with bonded surface coatings of the same.

In the past, ion implantation has been used to alter to the electrical properties of ceramic semiconducting materials—e.g., Si and GaAs—and to alter the wear and oxidation properties of metals. The state of the art is described in the following reference: J. K. Hirvonen, ed., "Ion Implantation", Vol. 18, *Treatise on Materials Science and Technology*, Academic Press, New York, (1980).

The following reference discusses damage effects produced in $\alpha$-$Al_2O_3$ single crystals by the implantation of $Pb^+$ ions: A. V. Drigo et al., Lattice Disorder in Implanted Insulators: Pb Implantation in $\alpha$-$Al_2O_3$, Radiation Effects, 33, 161–171 (1977).

It is an object of this invention to provide a new method for producing ceramic-surfaced tools and machine components characterized by increased hardness and/or toughness to fracture.

It is another object to provide ceramic-surfaced tools and machine components characterized by increased microhardness, wear-resistance, and/or toughness to fracture.

It is another object to provide a method for hardening ceramic rubbing surfaces, such as a work surface of a frictional clutch.

Other object will be made apparent hereinafter.

SUMMARY OF THE INVENTION

In one aspect, the invention is a method for hardening a tool or machine component having a ceramic near-surface region. Hardening is effected by mounting the article in an ion-implantation system and then ion-implanting the surface region with a metal ion to form therein a metastable alloy of the ion and the ceramic. In another aspect, the invention is a method for producing a hardened work surface. The method comprises the steps of providing an article having a ceramic work surface, and ion-implanting the work surface with a metal ion effecting formation therein of a metastable alloy of said ion and said ceramic. In another aspect, the invention is a method for hardening a ceramic work surface of an article. The article is mounted in a vacuum ion-implantation system, and its ceramic surface is implanted with metal ions which are randomly distributed between interstitial and substitutional positions in the lattice of the ceramic. In another aspect, the invention is an improved tool or machine component characterized by a ceramic near-surface region containing a metastable alloy of a metal ion and the ceramic.

DETAILED DESCRIPTION OF THE INVENTION

The following terms are used herein as follows: "ceramic-surfaced" refers to articles whose entire surface or a part thereof is ceramic material. "Ceramic" refers to surfaces or articles consisting principally of inorganic, non-metallic material; this category includes, but is not limited to, borides, nitrides, carbides, and oxides. (W. D. Kingery, *Introduction to Ceramics*, p. 3, John Wiley & Sons, (1960). The following are a few examples of such materials: $Al_2O_3$, SiC, $TiB_2$, $Si_3N_4$, TiC, $ZrO_2$, and HfN. "Near-surface region" refers to a subsurface region contiguous with the surface. "Tools" as used herein includes hand tools, machine tools, and implements. "Machine components" includes machine parts, a few examples of which are shafts, cams, fasteners, casings, bearings, linings, seats, gears, and clutches. The term "work surface" is used to refer to a surface which has been designed to perform work on another surface; for example, the term is used to refer to a surface which has been designed for cutting, boring, shaping, abrading, pounding, reducing, or frictionally engaging a second surface.

My method for improving ceramic-surfaced tools and machine components with respect to properties such as wear-resistance and resistance to shock is an outgrowth of experiments in which I implanted crystalline ceramic specimens with metal ions and measured the resulting change in selected mechanical properties of the specimens. With one exception, the implanted ceramics exhibited significant increases in hardness properties such as microhardness, fracture-toughness, or scratch-resistance. The hardened materials exhibited good thermal stability at elevated temperatures—e.g., temperatures up to 1450° C. for hardened $TiB_2$. The experimental results obtained with various ceramics and metal ions are presented hereinafter in experiments designated as 1 through 5.

Experiments 1–4 illustrate the principle of the invention. That is, these examples establish that significant hardening of near-surface regions of crystalline ceramics can be produced by implanting the regions with a metal ion to form a metastable alloy in which the implanted ion is randomly distributed between interstitial and substitutional lattice positions. It is implanted ions in the interstitial positions which effect the hardening. The hardening is referred to herein as an alloying effect.

Referring to experiments 1-5 in general, the ion implantations were conducted under vacuum ($10^{-5}$ to $10^{-7}$ torr) in conventional implantation apparatus. Implantation was conducted at ambient temperature; it is estimated that beam heating increased the sample temperature to less than 300° C. The typical implantation time was about an hour.

Figure 1:
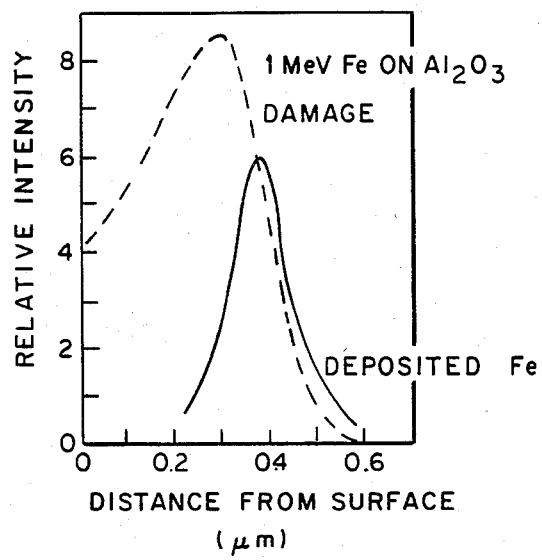
FIG. 1 is a graph showing deposited-energy and deposited-ion profiles for $Al_2O_3$ deposited with $Fe^+$ ions in accordance with the invention.

A summary of the implantation conditions is given in Table I. The average composition of the implanted zone is given as the ratio of the number of implanted ions to the number of matrix-metal atoms contained in an undamaged volume of the same size. The profile of the implanted species is approximately Gaussian (FIG. 1). Thus, the width of the implanted zone is expressed as the width at half-maximum and all the ions are considered to be located in a zone having this width.

TABLE I

| Material | Implant Species | Energy (keV) | Fluence (ions-cm$^{-2}$) | Composition (implanted Ion/ Matrix-metal atom) |
| --- | --- | --- | --- | --- |
| Al$_2$O$_3$ | Cr$^{++}$ | 300 | 0.1 × 10$^{17}$ | 0.055 |
| | | 95,190,280 | 0.2 × 10$^{17}$ | 0.0425 |
| | | 300 | 1.0 × 10$^{17}$ | 0.55 |
| | Ni$^+$ | 1000 | 0.5 × 10$^{17}$ | 0.0875 |
| | | | 1.0 × 10$^{17}$ | 0.175 |
| | Ti$^+$ | 150 | 0.1 × 10$^{17}$ | 0.064 |
| | Ti$^+$ | 150 | 0.3 × 10$^{17}$ | 0.192 |
| | Zr$^+$ | 150 | 0.2 × 10$^{17}$ | 0.128 |
| | Ge | 140 | 0.1 × 10$^{17}$ | 0.064 |
| | Fe$^+$ | 1000 | 2.0 × 10$^{17}$ | 0.350 |
| | | | 4.0 × 10$^{17}$ | 0.70 |
| SiC | Cr$^{++}$ | 95,190,280 | 0.2 × 10$^{17}$ | 0.05 |
| TiB$_2$ | Ni$^+$ | 1000 | 1.0 × 10$^{17}$ | 0.20 |

Mechanical properties for the implanted materials were evaluated by microhardness, fracture-toughness, and scratch-wear measurements. In all cases, only half of a specimen surface was implanted so that property measurements of unimplanted and implanted regions could be made under identical conditions. The mechanical properties are presented as relative values—i.e., ratio of implanted value to unimplanted value. The Knoop microhardness technique was used with a force of 0.147 N in order to confine the impression to the near surface region. Typical impression depths of 3000 Å exceed the depth of the implanted layer for the chromium implantations. As a result, the relative hardness values indicate the direction of property changes, but they may underestimate the magnitude of the effects in the implanted region.

Fracture-toughness was determined by calculating the apparent K$_{IC}$ from indentation cracking. Vickers microhardness indentations were made with 0.49, 0.98, 1.47, and 1.96 N forces and the ratio of crack length to diagonal determined. The results were calculated on the basis of a standard model.

Wear-resistance was determined from a conventional test in which the tangential force was measured as a diamond indenter moved across a surface at a fixed rate and normal force. It is shown that the specific energy of material removal is directly proportional to the tangential force and the ratio of the tangential force to the normal force given an abrasive friction coefficient. The percentages of the implanted ions in interstitial sites were determined by Rutherford channel-backscattering.

1 (Cr-implanted Al$_2$O$_3$)

Single crystals of Al$_2$O$_3$ were obtained from two commercial suppliers. Both materials had high-purity, low-dislocation density and were oriented within ±2 of (0001). Before implantation, each specimen was annealed for five days at 1200° C. in air to remove any mechanical damage introduced during sample preparation.

A Varian-Extrion 200-kV implanter was used to implant chromium in some of the Al$_2$O$_3$ samples. Chromium was selected because it is known to exhibit total solid solubility under equilibrium conditions and because there are published data on the hardness of Al$_2$O$_3$-Cr$_2$O$_3$ solid solutions.

Fluences of 10$^{16}$ and 10$^{17}$ ions-cm$^{-2}$ at a particle energy of 300 keV were used for some Al$_2$O$_3$ specimens. A graded energy implantation of 95, 190, and 280 keV to a total fluence of 2 × 10$^{16}$ ions-cm$^{-2}$ was used for the remaining Al$_2$O$_3$ specimens. Use of the graded energy implantations widens the implantation zone.

Figure 3:
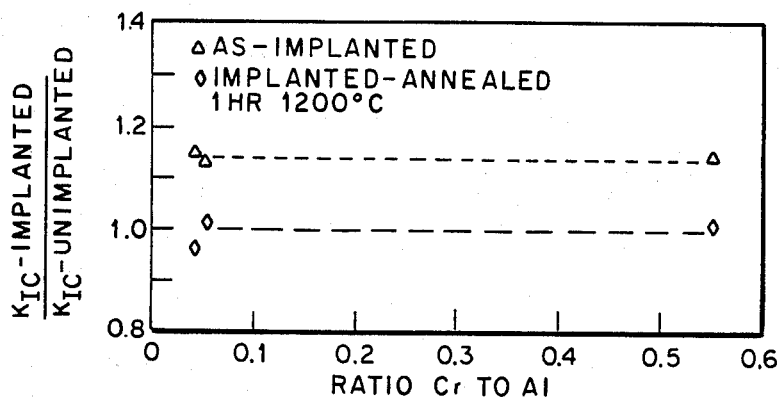
FIG. 3 is a graph showing the effect of annealing on the relative fracture toughness of $Al_2O_3$ implanted with $Cr^{++}$ in accordance with the invention.

Rutherford backscattering analysis showed large amounts of damage to both the Al and O sublattices in the as-implanted state. FIG. 3 gives the results for 10$^{17}$ Cr$^{++}$ ions-cm$^{-2}$ in Al$_2$O$_3$ (Cr to Al=0.55). Although the implanted-aligned curve is displaced upwardly from the virgin aligned crystal, it has not reached the implanted-random values. If an amorphous layer had formed, the aligned and random curves would overlap. Analysis of the backscattering from the implanted Cr reveals that near the surface (i.e., at low concentration and low damage), Cr occupies substitutional sites, but near the peak concentration those ions are randomly distributed among interstitial and substitutional sites.

Specimens from the Cr-graded energy implantation sample were prepared for examination by transmission electron microscopy by ion-milling from the unimplanted face. Thinned specimens were examined at 1 MeV accelerating potential in a Hitachi 1000 microscope. The electron-diffraction pattern showed the implanted zone to be crystalline despite damage. The TEM images contained a high density of "black spots" similar to those produced by low-temperature neutron radiation damage.

Annealing 1 h in air at 800° C. caused few changes in the RBS curves. Some recovery occurred at 1000° C. and most of the damage was removed at 1200° C. Most of the Cr had moved into substitutional lattice sites after the 1200° C. anneal but there was little change in the concentration profile, indicating that long-range diffusion of the chromium had not occurred. The RBS-derived information on lattice location and the data obtained from annealing were used to separate implantation damage effects from alloying effects for the Al$_2$O$_3$ specimens implanted with Cr, Ge, Ti, and Zr ions. Similar behaviour was inferred for the Ni and Fe implants.

Figure 2:
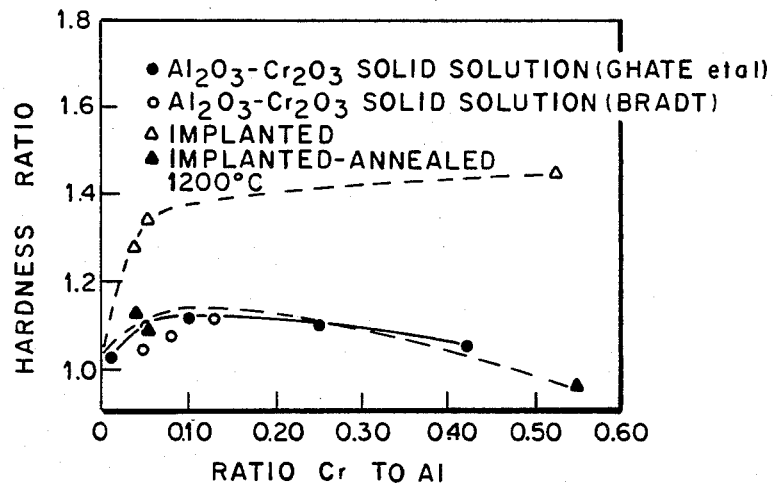
FIG. 2 is a graph comparing the relative hardnesses of $Cr/Al_2O_3$ alloys produced in accordance with the invention and conventional $Al_2O_3$-$Cr_2O_3$ equilibrium solid solutions.

FIG. 2 shows the relative hardness as a function of composition for the Cr-implanted Al$_2$O$_3$ Data reported by others for Al$_2$O$_3$-Cr$_2$O$_3$ solid solutions are also shown. The hardness for implanted samples is 28 to 45% greater than that for un-implanted ones. Annealing at 1200° C. moves implanted ions from interstitial positions to substitutional positions and thus reduces the hardness to values which lie close to the solid solution curve. As might be expected, the amount of implantation damage increased with increased fluence. The difference in the two curves is caused by one or more of the factors: (a) chromium in interstitial lattice sites, (b) point defect clusters, or (c) chromium-defect interactions.

Values of apparent $K_{IC}$ (FIG. 3) indicate a constant increase of about 15% for the entire range of composition. If this value of $K_{IC}$ is a reflection of the surface stress, it appears that the surface stresses saturate at some low fluence and remain constant. Annealing at 1200° C. returned the value of the apparent $K_{IC}$ to that of the virgin crystal.

The wear resistance of the graded-energy chromium implant (FIG. 1, Cr:Al=0.0425) was measured in the scratch-wear test. For normal forces of 0.196 and 0.294 N, the specific energy of material removal increased by 25% as the moving indenter passed from the unimplanted surface to the implanted region.

2 ($Al_2O_3$ Implanted With Ni or Fe)

The $Ni^+$ and $Fe^+$ implantations were carried out using a 5 MV Van de Graaff. The particle energy was 1 MeV. Nickel fluences of $0.5 \times 10^{17}$ ion-cm$^{-2}$ were used for the $Al_2O_3$ and $1 \times 10^{17}$ ions-cm$^{-2}$ for $TiB_2$. The doses of $Fe^+$ in $Al_2O_3$ were $2 \times 10^{17}$ ions-cm$^{-2}$.

Figure 4:
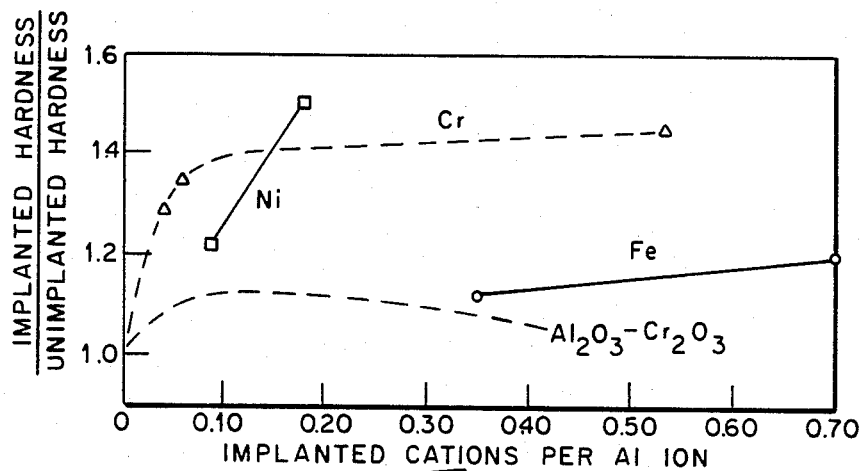
FIG. 4 is a graph comparing the relative hardness of $Al_2O_3$ specimens implanted with Fe or Ni ions.

The relative hardnesses of the $Ni^+$ and $Fe^+$ implanted $Al_2O_3$ is shown in FIG. 4. The hardness increased by 22% for a Ni-to-Al ratio of 0.35. The high-fluence Fe region contained 1.4 Fe ions for each molecule of $Al_2O_3$ and exhibited a hardness increase of 20%. Subsequent analysis showed that this increase was due in part to the abovementioned alloy effect. The metal-ion concentrations in these specimens greatly exceeded the solid solubility limit.

Figure 5:
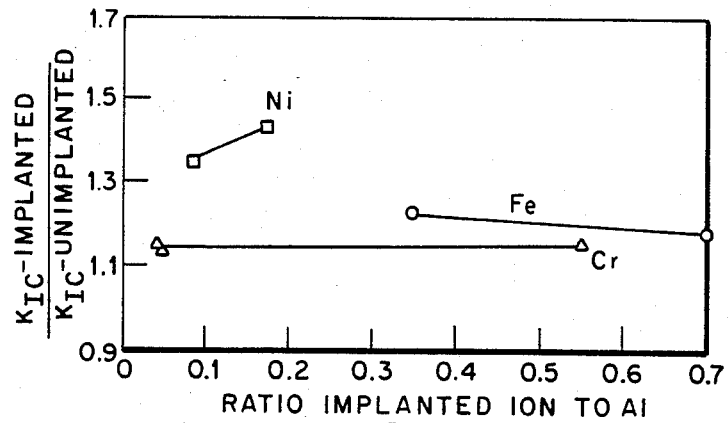
FIG. 5 is a graph comparing the relative indentation fracturetoughness of $Al_2O_3$ specimens implanted with Fe or Ni.

The apparent fracture-toughness increased more for the $Ni^+$ and $Fe^+$ implants than for the $Cr^{++}$. FIG. 5 shows increases of 35 and 43% for the $Ni^+$ specimens and 35 and 30% for the $Fe^+$.

3 (Ni-Implanted $TiB_2$)

Polycrystalline $TiB_2$ was prepared from powder which contained 1% oxygen as an impurity. Specimens having 98.4% theoretical density were prepared by vacuum hot-pressing at 2050° C. under 25 MPa for 4 h. The average grain size was 23μm, but the microstructure contained some grains as large as 75 to 100μm, indicating that considerable grain growth had occurred during processing.

The microhardness of the $TiB_2$ was determined after implantation to a Ni-to-Al ratio of 0.20. An increase of 69% was observed. Annealing for 2 h at 1425° C. reduced the hardness from the as-implanted value but it was still 1.44 times that of the unimplanted sample.

4 ($Al_2O_3$ Implanted with Ge, Ti, or Zr)

Single crystals of $Al_2O_3$ were implanted respectively with Ge (140 keV, $1 \times 10^{16}$ ions/cm$^2$), Ti (150 keV, $1 \times 10^{16}$ ions/cm$^2$), and Zr (150 keV, $2 \times 10^{16}$ ions/cm$^2$) and then tested as above. The hardness increased by 20% for the Ti- and Zr-implanted specimens and 40% for the Zr-implanted specimens. Fracture-toughness values for the Ti- and Zr-implanted samples increased 20-25%. The nature of the cracks produced during fracture-toughness tests on the Ge-implanted $Al_2O_3$ was different, indicating a change in the failure mechanism—i.e., the tests produced lateral cracks rather than radial cracks.

5 (Cr-implanted SiC)

Polycrystalline sintered SiC was prepared using boron and carbon as densification agents. The microstructure was fine grained (2 to 1 μm diameter) and equiaxed. Single crystals of SiC were grown during synthesis of SiC.

Implanting SiC with $Cr^{++}$ to a fluence of $2 \times 10^{16}$ ions-cm$^{-2}$ (Cr:Si=0.05) caused the bombarded region to become amorphous, as was determined by electron microscopy. Back-thinned specimens were prepared by ion milling from the unimplanted face. Specimens which allowed the damage along the ion range to be studied in profile were prepared by ion milling in a direction perpendicular to the implantation direction.

The hardness was unchanged by the implantations for both the polycrystalline and the single crystal specimens. Likewise, values for the apparent fracture toughness ($K_{IC}$) and specific energy of material removal were within the scatter of the data for both implanted and unimplanted surfaces.

The following is an example of my invention as applied to the production of a cutting tool.

EXAMPLE

A cutting tool is provided having a cutting edge which is coated with $Al_2O_3$. The tool is mounted in a standard ion-implantation system. With the system at a pressure of $10^{-6}$ Torr and at ambient temperature, one of the faces defining the cutting edge is implanted with $Cr^{++}$ cations at an energy level of 300 keV for one hour (resulting fluence, $0.1 \times 10^{17}$ ions/cm$^2$. The ion-implanting operation is terminated when the implanted-ion fluence reaches a value corresponding to a preselected increased hardness value. (The treatment time is a function of beam current and is not highly critical.) This treatment forms a metastable alloy of Cr and $Al_2O_3$ in the near-surface region contiguous with the surface exposed to the beam. The other face of the tool is similarly implanted to form the metastable alloy. The treatment significantly increases the wear resistance, microhardness, and fracturetoughness of the cutting edge.

As indicated above, the increase in the hardness properties produced by the invention is due at least in part to the formation of the above-mentioned metastable alloy, formed by "jamming" metal ions into ceramics at energy levels much higher than are required to bond the ion to the ceramic. Nearly any metal ion may be implanted to form the alloy. Implanting gas ions as described produces no measurable increase in hardness. In some of the metastable alloy produced in accordance with the invention (i.e., $Cr/Al_2O_3$), the metal ion is present in smaller concentrations than is typical for the corresponding equilibrium solid solution. In other cases (e.g., Ti or Fe in $Al_2O_3$), the metal ion is present in concentrations much larger than the normal value.

The invention is applicable to a wide variety of ceramic-and-metal systems. For most applications, it is preferable that the ceramic be one which in the unimplanted state is characterized by high hardness—as, for example, $Al_2O_3$, $TiB_2$, cubic BN and HfN.

The ceramic may or may not be be one which retains its crystallinity when implanted as described. In foregoing Experiment 5, the hardness of the amorphous SiC product was lower than for the crystalline SiC starting material. The amorphous layer was of low density and was not very adherent. In general, however, amorphous materials have very high hardnesses. It is believed that the invention may be used to produce ion-implanted, dense amorphous ceramic surfaces characterized by both high hardness and high wear-resistance. The ion selected for implanting may be any metal which forms the desired metastable alloy with the ceramic. The following are a few examples of other metal/alloy systems to which the invention may be applicable: Fe, Cr, Ni, and Zr implanted in $TiO_2$, TiC, or HfN; metal ions implanted in diamond; and metal ions in CBN. Given the teachings herein, one versed in the art can determine the suitability of a particular metal/ceramic system by merely routine experimentation. In applications where the area to be hardened is larger than the implantation beam size, rastering of the beam or re-positioning of the workpiece is effected by any suitable technique.

As indicated above, the invention can be used to produce hardened ceramic surfaces which retain their enhanced hardness at high temperatures. Thus, the hardened articles are useful at elevated temperatures characteristic of many industrial applications, such as grinding, drilling, turning, and cutting. For instance, even though the Ni-implanted $TiB_2$ described in Example 2 was annealed for 2 hours at 1425° C. for research purposes, its hardness exceeded that of the unimplanted control by 44%.

The invention may be conducted over a relatively wide range of implantation conditions. For instance, a desired fluence (dose) may be attained over a wide range of implantation energy levels; the same fluence has been achieved at approximately 90 keV and $10^3$ keV. Very significant increases in hardness may be obtained with implantation conditions selected to introduce from about 35% to 100% of the implanted ions in interstitial lattice sites. Such results have been obtained with implantation energies in the range from about 95 keV to $10^3$ keV. Doserate is not highly critical. Although the above-described experiments were conducted with implantation times of about one hour, the same fluences can be produced in about ten minutes in certain other available implantation systems. Fluence and temperature believed to be the most critical process variables. Too high a fluence results in sputtering and excessive loss of the implanted metal by evaporation, whereas too low a fluence results in little or no improvement in hardness. As indicated by FIG. 4, hardness generally increases with fluence. We have found that fluences of from $0.1 \times 10^{17}$ to at least $1 \times 10^{17}$ $Cr^{++}cm^{-2}$ or $0.2 \times 10^{17}$ to $0.4 \times 10^{17}$ $Ti^+$ $cm^{-2}$ cause significant hardening when implanted at room temperature. However, repeating the experiments at a very low temperature (77K) causes the $Al_2O_3$ to become amorphous and its hardness decreases to only 75% of its initial value. Also, repeating the experiments at very high temperatures ($\sim 450°$ C.) produces no hardening in excess of the normal equilibrium-alloy value. Given the teachings herein, merely routine experimentation would be required to establish the most suitable implantation conditions for a given metal-and-ceramic system.

Referring to the ion-implanted near-surface region, the thickness of this region varies relatively little with fluence. Typically, the implanted-region profile (hardness profile) is Gaussian, and the region extends to within a few hundred to a few thousand interatomic spacings of the surface. In the above-mentioned experiments, the implanted layer has a thickness (half-width) in the range of from a few tenths of a micron to 0.5 micron. In the case of Cr-implanted $Al_2O_3$, the hardness gradient peaked at about 0.1 micron below the surface. By implanting at a first relatively low energy level and then at one or more higher levels, it may be possible to produce near-surface region with a flatter hardness gradient.

Table 2 compares the Knoop-scale of my implanted $Al_2O_3$ and $TiB_2$ with the un-implanted values and with "superhard" materials currently used in tooling and wear applications. It will be noted that the implanted $TiB_2$ approaches the hardness of cubic boron nitride (CBN), which is second only to diamond. Because CBN is produced by an ultra-high pressure technique, components comprised of this material are relatively expensive and limited in size.

TABLE 2

| HARDNESS OF SUPERHARD MATERIALS* | |
|---|---|
| Materials | Knoop Hardness (GPa) |
| Single Crystal Diamond | <88 |
| Sintered Diamond Compacts | 63–78 |
| Cubic Boron Nitride | 44 |
| Ni—implanted $TiB_2$ | 40 |
| SiC | 25 |
| $TiB_2$ | 23 |
| Implanted $Al_2O_3$ | 23–30 |
| $Al_2O_3$ | 19 |
| WC—Co | 18–22 |

*Hardness values for un-implanted materials taken from the following publication: R. H. Wentorf et al., Sintered Superhard Materials, *Science*, 208, 873–880 (1980).

The foregoing description of a preferred form of the invention has been presented for purposes of illustration and description. It is not intended to be exhaustive or to limit the invention to the precise form disclosed, and obviously many modifications and variations are possible in light of the above teaching. It is intended that the scope of the invention be defined by the claims appended hereto.

What is claimed is:

1. A method for increasing the hardness of a near-surface region of an article, comprising:
    mounting in an ion-implantation system an article having a near-surface region of a refractory material selected from the group consisting of ceramic and diamond,
    producing an increase in the hardness of said region by ion-implanting the same with metal ions to effect formation of a metastable alloy in which the implanted ions are distributed between substitutional and interstitial lattice sites, and
    terminating said ion-implanting when the implanted-ion fluence reaches a value corresponding to a preselected increased hardness value.

2. A method for increasing the hardness of a ceramic surface, comprising:
    ion-implanting said surface with metal ions in vacuum to form therein a binary metastable alloy wherein from about 35% to 100% of the implanted ions are in interstitial lattice sites, and
    terminating said ion-implanting when the implanted-ion fluence reaches a value corresponding to a preselected increased hardness value defined by about 35% to 100% of the interstitial lattice sites in said surface containing the implanted ions.

3. A method for increasing the hardness of a ceramic surface, comprising:
    ion-implanting said surface with metal ions in vacuum and at an implantation energy from about 95 keV to $10^3$ keV to form in said surface a metastable alloy in which from about 35% to 100% of the implanted ions are in interstitial lattice positions.

4. The method of claim 3 wherein said ion-implanting is effected at room temperature.

5. A method for increasing the hardness of a work surface of a machine component, comprising:
providing an article in the form of a machine component and a tool, said article having a ceramic work surface, and
ion-implanting said surface with a selected metal ion at a temperature effecting formation therein of a binary alloy of said ceramic and ions selected in which from about 35% to 100% of the implanted ions are in interstitial lattice sites.

* * * * *